(12) United States Patent
Pilo et al.

(10) Patent No.: US 10,706,916 B1
(45) Date of Patent: Jul. 7, 2020

(54) METHOD AND APPARATUS FOR INTEGRATED LEVEL-SHIFTER AND MEMORY CLOCK

(71) Applicant: Synopsis, Inc., Mountain View, CA (US)

(72) Inventors: Harold Pilo, Underhill, VT (US); John Edward Barth, Jr., Williston, VT (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/374,666

(22) Filed: Apr. 3, 2019

(51) Int. Cl.
*G11C 11/417* (2006.01)

(52) U.S. Cl.
CPC .................................. *G11C 11/417* (2013.01)

(58) Field of Classification Search
CPC ................................... G11C 7/08; G11C 7/12
USPC .............................................. 365/189.11, 205
See application file for complete search history.

(56) References Cited

U.S. PATENT DOCUMENTS

| | | | |
|---|---|---|---|
| 7,777,522 B2 | 8/2010 | Yang et al. | |
| 8,258,848 B2 | 3/2012 | Chen | |
| 10,432,102 B2* | 10/2019 | Albertini | H02M 3/33584 |
| 10,566,992 B2* | 2/2020 | Lesso | H03M 1/508 |
| 2004/0125905 A1* | 7/2004 | Vlasenko | H03L 7/0814 |
| | | | 375/376 |
| 2004/0239388 A1* | 12/2004 | Lee | H03K 5/131 |
| | | | 327/158 |
| 2005/0001663 A1* | 1/2005 | Lee | H03L 7/0805 |
| | | | 327/158 |
| 2005/0088211 A1* | 4/2005 | Kim | H03L 7/0812 |
| | | | 327/158 |
| 2005/0146365 A1* | 7/2005 | Kim | H03K 5/135 |
| | | | 327/161 |
| 2006/0132203 A1* | 6/2006 | Lee | H03L 7/0814 |
| | | | 327/158 |
| 2007/0046345 A1* | 3/2007 | Tai | H03K 5/1565 |
| | | | 327/158 |
| 2008/0136475 A1* | 6/2008 | Gomm | H03L 7/0814 |
| | | | 327/158 |
| 2008/0157836 A1* | 7/2008 | Cho | H03L 7/0814 |
| | | | 327/158 |
| 2008/0169853 A1* | 7/2008 | Park | H03L 7/0812 |
| | | | 327/158 |
| 2009/0102510 A1* | 4/2009 | Park | H04L 25/0278 |
| | | | 326/30 |
| 2010/0085099 A1* | 4/2010 | Ma | G06F 1/06 |
| | | | 327/295 |
| 2010/0141323 A1* | 6/2010 | Kim | H03K 5/133 |
| | | | 327/261 |
| 2010/0164572 A1* | 7/2010 | Kim | G11C 7/1045 |
| | | | 327/158 |
| 2011/0057697 A1* | 3/2011 | Miyano | H03L 7/0814 |
| | | | 327/158 |

(Continued)

*Primary Examiner* — Michael T Tran
(74) *Attorney, Agent, or Firm* — Fenwick & West LLP

(57) ABSTRACT

An integrated level-shifter and memory clock is disclosed that minimizes delay of voltage level-shifting from an external clock on a first logic supply voltage to an internal clock on a higher array supply voltage that is pulse-width independent of the external clock used to generate the internal clock. The generation of the internal clock on the higher array supply voltages is accomplished in two stages of logic. An array-tracking timing delay circuit mimics access delay to generate a MRST_P to reset the internal clock on the higher array supply voltage.

18 Claims, 2 Drawing Sheets

(56) References Cited

U.S. PATENT DOCUMENTS

| | | | |
|---|---|---|---|
| 2011/0156779 A1* | 6/2011 | Kim | H03L 7/081 |
| | | | 327/158 |
| 2011/0187432 A1* | 8/2011 | Kim | H03K 5/15 |
| | | | 327/237 |
| 2011/0291720 A1* | 12/2011 | Ku | H03L 7/0814 |
| | | | 327/158 |
| 2012/0105119 A1* | 5/2012 | Kim | H03L 7/0816 |
| | | | 327/158 |
| 2013/0002322 A1* | 1/2013 | Chung, II | H03L 7/0812 |
| | | | 327/158 |
| 2013/0038363 A1* | 2/2013 | Lee | H03L 7/0812 |
| | | | 327/149 |
| 2013/0163366 A1* | 6/2013 | Jung | G11C 7/1066 |
| | | | 365/233.1 |
| 2013/0207701 A1* | 8/2013 | Kitagawa | H03K 5/06 |
| | | | 327/158 |
| 2016/0269012 A1* | 9/2016 | Takahashi | H03K 5/1534 |
| 2017/0060789 A1* | 3/2017 | Noda | G06F 13/1673 |
| 2017/0207777 A1* | 7/2017 | Lo | H03K 5/135 |
| 2017/0338825 A1* | 11/2017 | Lee | H03K 19/20 |
| 2018/0173270 A1* | 6/2018 | Lee | G11C 7/1039 |
| 2019/0147942 A1* | 5/2019 | Jain | G11C 11/418 |
| | | | 365/156 |
| 2019/0348094 A1* | 11/2019 | Park | G11C 7/1087 |
| 2020/0052678 A1* | 2/2020 | Chen | H03K 19/018521 |
| 2020/0058333 A1* | 2/2020 | Bell | G11C 11/4076 |
| 2020/0058345 A1* | 2/2020 | Kim | G11C 7/1057 |
| 2020/0059237 A1* | 2/2020 | Shi | H03K 19/20 |

\* cited by examiner

METHOD AND APPARATUS FOR INTEGRATED LEVEL-SHIFTER AND MEMORY CLOCK

FIELD OF INVENTION

The disclosure generally relates to level-shifters, and more particularly relates to a level-shifter with minimal performance overhead.

BACKGROUND

Power consumption in integrated circuits has become increasingly important primarily due to wide spread use of battery powered portable and handheld appliances. As integrated circuits develop, lower power implementations of digital and analog circuits are constantly being developed. CMOS (complementary metal oxide silicon) compared to the earlier developed TTL (transistor transistor logic) provides a simple example. Some of the characteristics of TTL logic circuits include power dissipation that is usually 10 mW per gate, voltage levels that range from 0 to Vcc where Vcc is typically 4.75V to 5.25V. For TTL, a voltage range of 0V-0.8V creates a logic level 0 or low while a voltage range of 2V-Vcc creates a logic level 1 or high. Whereas, some of the characteristics of CMOS logic circuits include much lower power dissipation, typically 10 nW per gate, since there is complementary-symmetry. The complementary-symmetry refers to the typical design style with CMOS using complementary and symmetrical pairs of p-type and n-type metal oxide semiconductor field effect transistors (MOSFETs) for logic functions. Since one transistor of the pair is always off, CMOS devices provide low static power consumption. The series combination of CMOS devices only draws significant power momentarily during switching between on and off states. Another important characteristic of CMOS devices is high noise immunity, a logic level 0 or low is between 0 and ⅓ VDD while a logic level 1 or high is between ⅔ VDD and VDD. With high noise immunity, lower supply power can be used. Although, power consumption can be reduced by lowering the supply voltage, lowering the supply voltage does not work for all circuits. In IC design, hybrid circuits requiring different input voltages are not uncommon, and circuits using lower voltage power supplies are frequently connected with circuits using higher voltage power supplies.

Particularly in multi-core system-on-chip (SoC) integrated circuits that are often used to process multimedia data in appliances and consumer devices such as cellular phones, high-speed operation and low-power consumption are much desired features. Conventionally, high speed performance is achieved by transistor scaling and low-power operation by supply-voltage scaling. However, circuits that include SRAM bitcells require more power and limit power supply scaling in SoC's. Dual-rail or dual-supply memory designs are needed to enable SoC voltage scaling to achieve optimum power consumption, speed, durability while still being able supply a higher voltage level for the SRAM bitcell. Another challenge with the dual-rail or dual-supply memory designs is pulse-width for the generated clock signal to access the SRAM bitcells. Often times, the pulse-width for the generated clock to access the SRAM bitcell is similar to the main clock. However, in order to avail integrated circuit designers extra flexibility, increased margins, robustness to their circuit designs, it is preferable to generate a level-shifted internal clock that is independent of the external clock pulse-width. Also, these dual-rail or dual-supply memory designs having level-shifter circuits introduce additional delay to the clock path for the SRAM bitcell. The overall result is loss of flexibility, reduced margins, lack of robustness to circuit designs in addition to slower access time, response, and additional delay associated with access to the SRAM bitcell. Accordingly, there is a need for a level-shifter that minimizes delay of voltage level-shifting from an external clock on a first logic supply voltage to an internal clock on a higher array supply voltage that is pulse-width independent of the internal clock used to generate the internal clock on the higher array supply voltage.

SUMMARY OF THE INVENTION

A novel integrated level-shifter and clock generator is disclosed which overcomes disadvantages of previous level-shifters. The novel integrated level-shifter and memory clock minimizes delay of voltage level-shifting from an external clock on a first logic supply voltage to an internal clock on a higher array supply voltage that is pulse-width independent of the external clock used to generate the internal clock. The generation of the internal clock on the higher array supply voltages is accomplished in two stages of logic.

The novel integrated level-shifter and clock generator is configured to provide an internal clock (CLKI) signal in a high voltage domain in response to an external clock (CLK) signal in a low voltage domain. The level-shifting circuit comprises a first NFET having a gate coupled to the CLK signal, a drain coupled to a NCLK_N node, and a source coupled a first intermediate node, a second NFET having a drain coupled to the first intermediate node, a source coupled to ground, and a gate coupled to an ENCLK_T node, a first PFET having a gate coupled to the CLK signal, a drain coupled to the NCLK_N node, and a source coupled to a second intermediate node, a second PFET having a drain coupled to the second intermediate node, a source coupled to a high voltage source in the high voltage domain, and a gate coupled to the CLKI signal, a third NFET having a drain coupled to the NCLK_N node, a source coupled to the first intermediate node, and a gate coupled to the CLKI signal, a first inverter having an input coupled to the NCLK_N node and an output coupled to the CLKI signal, a third PFET having a source coupled to the high voltage source in the high voltage domain, a gate coupled to the ENCLK_T node, and a drain coupled to NCLK_N node, a second inverter having an input coupled to the CLK signal and an output coupled to a third intermediate node, a first nor gate having a first input coupled to the third intermediate node, a second input coupled to the ENCLK_T node, and an output coupled to a fourth intermediate node, and a second nor gate having a first input coupled to the fourth intermediate node; a second input coupled to a MRST_P input signal, and an output coupled to the ENCLK_T node.

In accordance to an aspect of the present invention, the third NFET is configured as a half-latch to maintain the NCLK_N node at a discharged state. Even if the CLK signal is no longer active, the active CLKI signal turns on the third NFET which keeps node NCLK_N at VSS and the CLKI signal activated independent of the inactive CLK signal.

In accordance to yet another aspect of the present invention, the CLK signal propagates through two gate delays to generate the CLKI signal. Two gate delays compared with prior art level-shifters provide much faster access and improvement in SRAM memory performance.

DESCRIPTION OF THE DRAWINGS

The foregoing and other aspects of the disclosure can be better understood from the following detailed description of the embodiments when taken in conjunction with the accompanying drawings.

DETAILED DESCRIPTION OF THE EMBODIMENTS

In the following detailed description of the embodiments, reference is made to the accompanying drawings, which form a part hereof, and in which is shown by way of illustration of specific embodiments in which the disclosure may be practiced. The present disclosure may, however, be embodied in different forms and should not be construed as limited to the embodiments set forth herein. It is also appreciated that the terms such as "first", "second", "third", etc. are used to distinguish between elements such terms describe. These terms are not necessarily intended to indicate temporal or prioritization of such elements, unless otherwise explicitly stated.

Figure 1:
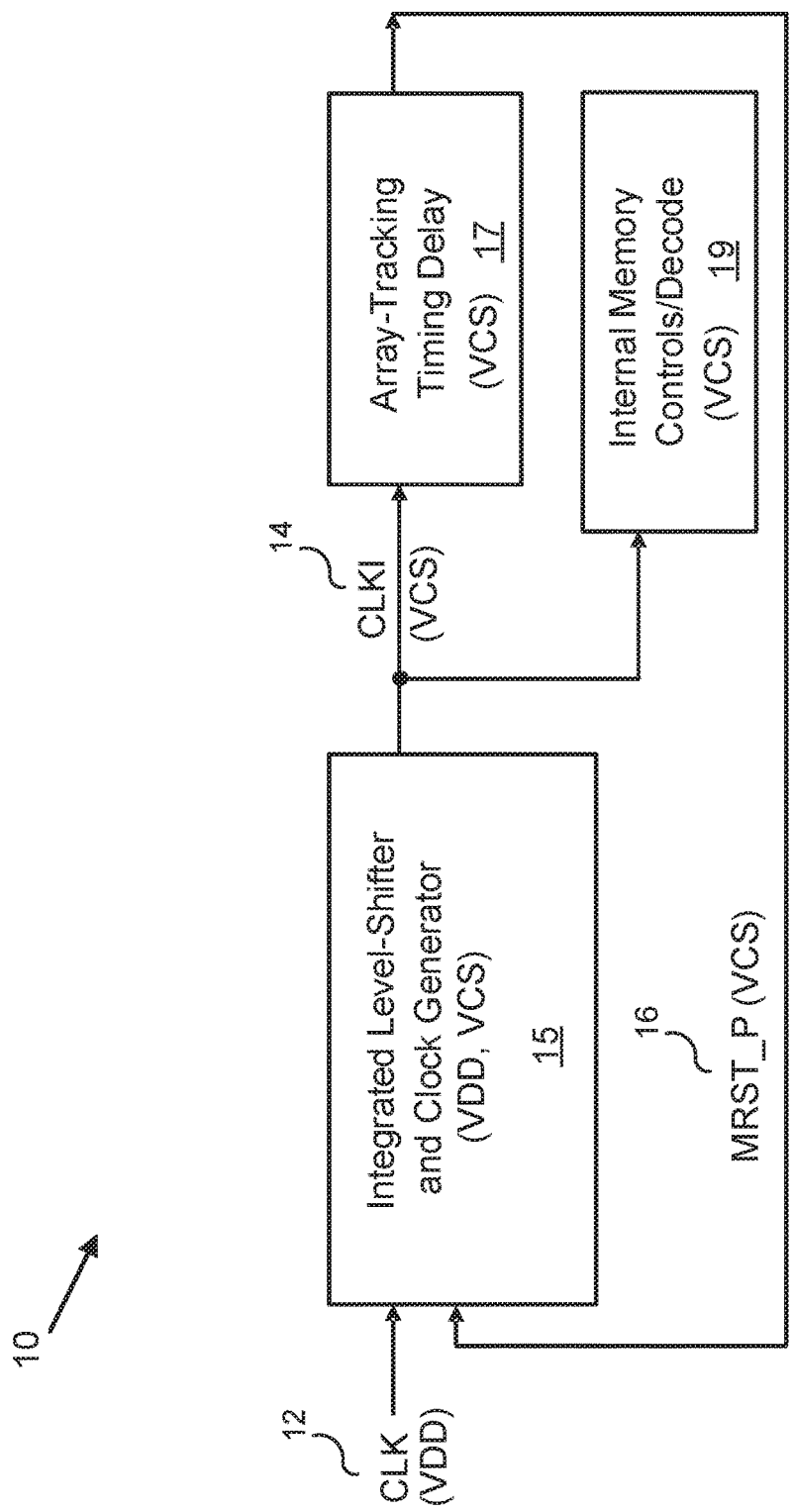
FIG. 1 illustrates an integrated level-shifter and clock generator system in accordance to an embodiment of the present invention.

FIG. 1 illustrates an integrated level-shifter and clock generation system 10 in accordance to an embodiment of the present invention. The integrated level-shifter and clock generation system 10 includes an integrated level-shifter and clock generator 15, an array-tracking timing delay 17, and an internal memory controls and decode 19 for processing data to and from the internal memory. A parenthetical adjacent a named element indicates which power domain the element presides. For example, the integrated level-shifter and clock generator 15 receives power from both power domains: VDD and VCS (voltage core supply of the memory bitcell). The integrated level-shifter and clock generator 15 receives an external clock input signal, CLK 12 on a VDD power domain or SoC logic power supply and level-shifts the external CLK 12 to provide an internal CLKI 14 on a VCS power domain or high voltage power domain to the array-tracking timing delay 17 and the internal memory controls and decode 19. Both the array-tracking timing delay 17 and the internal memory controls and decode 19 are coupled to the higher power domain or the VCS power domain. The integrated level-shifter and clock generator 15 outputs the internal CLKI 14 to the array-tracking timing delay 17 which tracks access time to the internal memory controls and decode 19. The array-tracking timing delay 17 generates a MRST_P 16 signal which resets the CLKI 14 signal independent of the external CLK 12 pulse-width or period. Stated differently, the pulse-width or period of the external CLK 12 does not affect and is independent of the internally generated CLKI 14 signal. Moreover, the internal CLKI 14 pulse-width or period is determined by the internal memory controls and decode time requirements to complete a read or write transaction operation.

Figure 2:
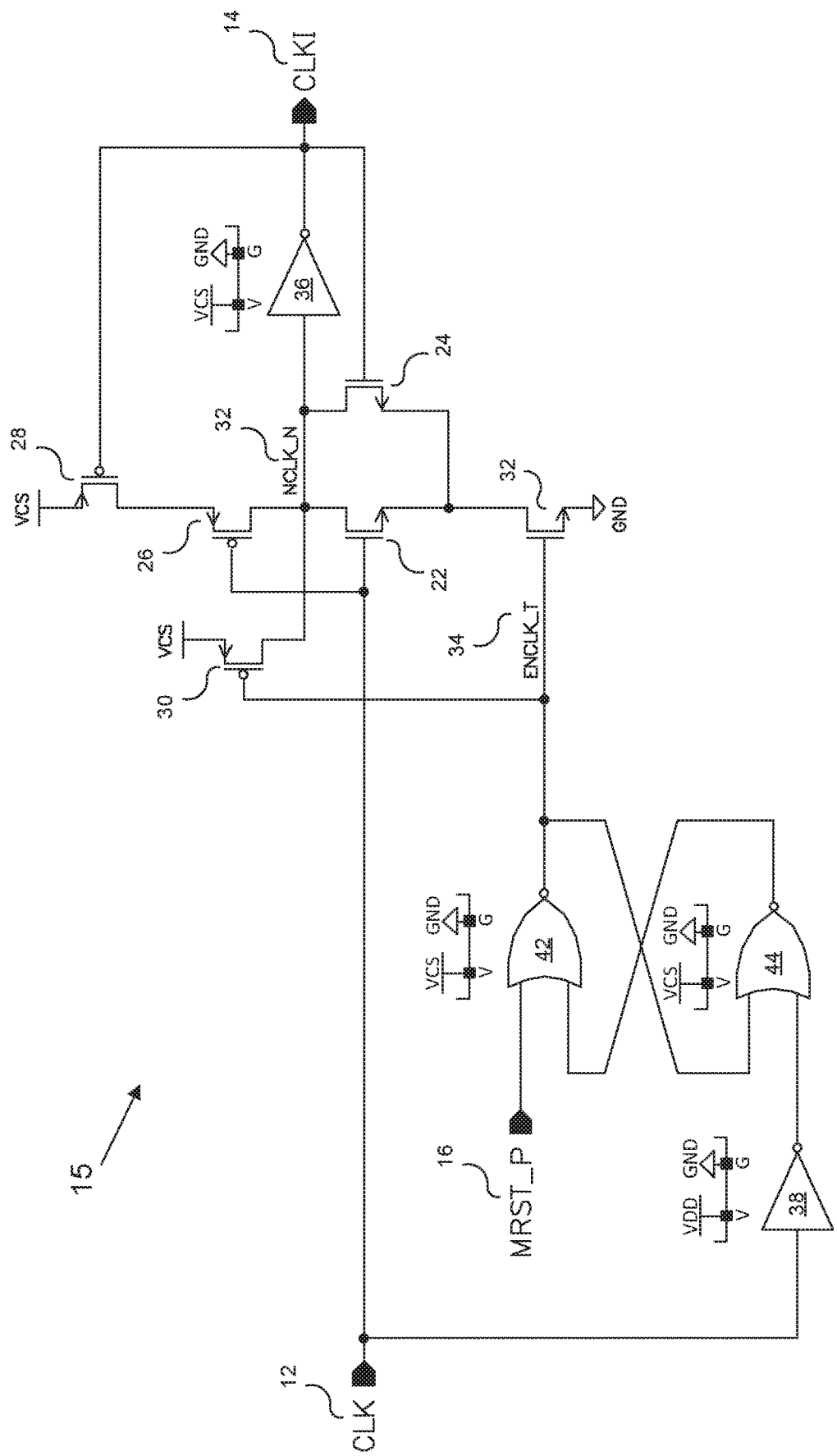
FIG. 2 illustrates a block diagram of the integrated level-shifter and clock generator in accordance to an embodiment of the present invention.

FIG. 2 illustrates a block diagram of an integrated level-shifter and clock generator 15 in accordance to an embodiment of the present invention. The integrated level-shifter and clock generator 15 includes two power domains. A first power domain is a VDD domain or SoC logic power supply, and a second power domain is a VCS (voltage core supply) or memory internal voltage supply. As discussed earlier, power supply voltage scaling of SoC logic power supply is typically limited by SRAM bitcells. Dual-rail or dual power supply memory designs provide SoC voltage scaling while maintaining a higher voltage for the SRAM bitcell. Dual-rail memory designs generally require incoming signals to the SRAM bitcell to be level-shifted to a higher voltage to enable access with the higher voltage requirements of the SRAM bitcell. In accordance to an embodiment of the present invention, only inverter 38 is coupled to the VDD domain while all other devices illustrated in FIG. 2 are coupled to the VCS domain or higher memory internal voltage supply. To further highlight the different input voltages of the dual-rail memory design of the integrated level-shifter and clock generator 15, inverter 38 includes corresponding power and ground designations to show its power and ground is coupled to the VDD domain, while NOR gate 42, NOR gate 44, and inverter 36 include corresponding power and ground designations to show their power and ground are coupled to the VCS domain.

Referring to FIG. 2, an external CLK 12 in the VDD domain is coupled to an input of inverter 38. It is noted that inverter 38 is coupled to the VDD domain. A first input of NOR gate 44 is coupled to an output of inverter 38. An output of the NOR gate 44 is coupled to a first input of NOR gate 42. A second input of NOR gate 42 is coupled to the MRST_P 16 from the array-tracking timing delay 17 (FIG. 1). The array-tracking timing delay 17 is coupled to the VCS domain. An output of the NOR gate 42 is coupled to node ENCLK_T 34 which is also coupled to a second input of NOR gate 44. The external CLK 12 is also coupled to a gate of NFET 22 with a source of NFET 22 coupled to a drain of NFET 32. A source of NFET 32 is coupled to ground, and a gate of NMOS 32 is coupled to node ENCLK_T 34. A gate of PFET 30 is coupled to the node ENCLK_T 34, and a source of PFET 30 is coupled to VCS. A drain of PFET 30 is coupled to node NCLK_N 32. Node NCLK_N 32 is also coupled to a drain of NFET 22 and a drain of PFET 26. A gate of PFET 26 is coupled to the external CLK 12, and a source of PFET 26 is coupled to a drain of PFET 28. A source of PFET 28 is coupled to VCS, and a gate of PFET 28 is coupled to internal CLKI 14. A gate of NFET 24 is coupled internal CLKI 14, and a source of NFET 24 is coupled to the drain of NFET 32 and the source of NFET 22. The node NCLK_N 32 is coupled to a drain of NFET 24 and an input of inverter 36. The output of inverter 36 is coupled to internal CLKI 14. It is noted that inverter 36 is coupled to the VCS domain.

In operation, a VDD-driven external CLK 12 rising edge (or active phase) is received at the gate of NFET 22 which turns-on NFET 22. Turning on NFET 22 discharges node NCLK_N 32 (node clock_N) in response to the active external CLK 12. NFET 22 is sized sufficiently large to overcome current from small PFET 26 and small PFET 28 and discharges node NCLK_N 32. Moreover, PFET 28 in accordance to an embodiment of the present invention is configured as a half-latch restore device that maintains node NCLK_N 32 voltage near VCS during inactive phase of internal clock CLKI 14. In general, a half-latch is a gate with positive feedback implemented with a weak pull-up. In the present case, when external CLK 12 is low or not active, PFET 28 and PFET 26 are turned-on and maintains node NCLK_N 32 at or near VCS. However, when external CLK 12 becomes active, NFET 22 is sized sufficiently large to discharge node NCLK_N 32 to a discharged or low state. The discharged or low state of node NCLK_N 32 is applied to the input of inverter 36, and the inverter 36 generates the output for internal CLKI 14 that is on the VCS domain or memory internal voltage supply. It should be noted that the level-shifting from the external CLK 12 on the VDD domain or SoC logic power supply to the internal CLKI 14 on the VCS domain or memory internal voltage supply takes two gate delays. The first delay inverts the positive active external CLK 12 to a low state at node NCLK_N 32. The second delay occurs when the inverter 36 receives the low state at the input and inverts the NCLK_N 32 input to generate the internal CLKI 14. Accordingly, an embodiment of the present invention provides an integrated level-shifter and clock generator 15 that minimizes memory clock level-shifting to two gate delays.

The internal CLKI 14 remains active until the array-tracking timing delay 17 issues a MRST_P 16 (master reset_P) to the integrated level-shifter and clock generator 15 at the MRST_P 16 input of NOR gate 42. The internal CLKI 14 pulse-width is determined by the memory array-bitcell requirements to complete a read or write operation. The array-tracking timing delay 17 mimics the access timing of an array bit cell, e.g. dummy array cell to generate the MRST_P 16. In accordance to an embodiment of the present invention, a plurality of inverters in series provides a delay for the generation of the MRST_P 16 from the array-tracking timing delay 17. The array-tracking timing delay 17 generates the MRST_P 16 to reset the internal CLKI 14 independent of the external CLK 12 pulse-width or period. Referring to FIG. 2, a CLKI 14 reset and CLK 12 interlock circuit comprises cross-coupled NOR gate 42 and NOR gate 44 on the VCS domain that provide a level-shifting function to the VDD-driven incoming external CLK 12. In operation, the CLKI 14 reset and CLK 12 interlock circuit has two possible scenarios.

A first scenario is resetting the internal CLKI 14 while the external CLK 12 is still active (at VDD). A MRST_P 16 is generated from the array-tracking timing delay 17. An active MRST_P 16 applied to NOR gate 42 drives node ENCLK_T 34 to a low state or near VSS. The low state or near VSS of node ENCLK_T 34 is fed back to an input of NOR gate 44. The other input to NOR gate 44 is coupled to an output from inverter 38 that inverts the active external CLK 12 at VDD. Accordingly, the two inputs to NOR gate 44 are both at low states which generates a logic high at the output of NOR gate 44 which is applied to an input of NOR gate 42. Recall in this scenario MRST_P 16 is a logic high. Two logic highs inputs to NOR gate 42 generates a logic low that maintains node ENCLK_T 34 at the low state or near VSS. The low state or near VSS at node ENCLK_T 34 is applied to the gate of PFET 30 which turns-on and drives node NCLK_N 32 to a high state. Node NCLK_N 32 also provides an input to inverter 36. Inverter 36 inverts the high state at node NCLK_N 32 to provide a low or inactive internal CLKI 14 which completes the reset of the internal CLKI 14.

A second scenario is resetting the internal CLKI 14 with the MRST_P 16 after the external CLK 12 has already transitioned to inactive or near VSS. Since the external CLK 12 is inactive or near VSS and is applied to inverter 38, the output of inverter 38 is active or near VDD (recall inverter 38 is in the VDD domain) and is applied to an input of NOR gate 44. Node ENCLK_T 34 is near VCS prior to activation of the MRST_P 16 since the internal CLKI 14 is active. Node ENCLK_T 34 is applied to an input of NOR gate 44, and the other input to the NOR gate 44 is coupled to the output of inverter 38 which is a logic high because the external CLK 12 is inactive or near VSS. A logic high and a logic low inputs to NOR gate 44 produces a logic low output from NOR gate 44. It should be noted that inverter 38 is in the VDD domain, and the VCS-driven input to NOR gate 44 shuts off or prevents potential shoot-through current caused by VDD-driven output of inverter 38 which further provides effective level-shifting function. As MRST_P 16 transitions to near VCS to initialize an internal CLKI 14 reset that is applied to NOR gate 42, the other input to NOR gate 42 receives the logic low output from NOR gate 44. A logic high and logic low inputs applied to NOR gate 42 generates a logic low output for node ENCLK_T 34 which turns on PFET 30 to drive node NCLK_N 32 to a logic high. A logic high a node NCLK_N 32 is applied to the input of inverter 36 which generates a logic low for resetting the internal CLKI 14. It should be noted that NOR gate 44 can incur a small amount of shoot-through current as the NOR gate 44 includes a NOR PFET stack that is not completely shut off by the VDD-driven signal from the inverter 38. Therefore, in accordance to an embodiment of the present invention, NOR gate 44 is designed with the NFET larger than the PFET to minimize the momentary shoot-through while MRST_P 16 is active. Once MRST_P 16 returns to VSS which causes node ENCLK_T 34 to be near VCS, the momentary shoot-through condition is eliminated and the integrated level-shifter and clock generator 15 is ready to receive another external CLK 12 cycle.

As discussed above, the integrated level-shifter and clock generator 15 receives the external CLK 12 in the VDD domain (or SoC power supply) and generates an internal CLKI 14 in the VCS domain (or memory internal voltage supply) that is independent of the external CLK 12 pulse-width or period. The integrated level-shifter and clock generator 15 includes a clock activation half-latch configured to latch the external CLK 12 active pulse that enables a minimum external CLK 12 pulse-width for generation of the internal CLKI 14. In operation, an external CLK 12 rising edge is applied to the gate of NFET 22 which discharges node NCLK_N 32 to near VSS via NFET 22 and NFET 32. As node NCLK_N 32 is discharged and applied to the input of inverter 36, an active internal CLKI 14 is generated which turns on NFET 24. As discussed above, a half-latch is a gate with positive feedback implemented with a weak pull-up. In this particular case, NFET 24 turns on and maintains node NCLK_N 32 at the VSS state which continues activation of the internal CLKI 14 even when the external CLK 12 becomes inactive. The internal CLKI 14 signal is not pulse-width dependent on the external CLK 12. In accordance with an embodiment of the present invention, the integrated level-shifter and clock generator 15 generates an internal CLKI 14 in the VCS domain that is pulse-width independent of the external CLK 12 in the VDD domain. Many prior art level-shifter designs do not function when the external CLK 12 has a shortened pulse-width. Accordingly, an integrated level-shifter and clock generator is disclosed that minimizes delay of voltage level-shifting of the external clock from a first logic supply voltage to an internal clock at a higher array supply voltage and is pulse-width independent of the external clock that is used to generate the internal clock for the higher array supply voltage.

While the disclosure has been described with reference to certain embodiments, it is to be understood that the disclosure is not limited to such embodiments. Rather, the disclosure should be understood and construed in its broadest meaning, as reflected by the following claims. Thus, these claims are to be understood as incorporating not only the apparatuses, methods, and systems described herein, but all those other and further alterations and modifications as would be apparent to those of ordinary skilled in the art.

We claim:

1. A level-shifting circuit configured to provide a CLKI signal in a high voltage domain in response to a CLK signal in a low voltage domain, comprising:
   a first NFET having a gate coupled to the CLK signal in the low voltage domain, a drain coupled to a NCLK_N node, and a source coupled to a first intermediate node;
   a second NFET having a drain coupled to the first intermediate node, a source coupled to ground, and a gate coupled to an ENCLK_T node;
   a first PFET having a gate coupled to the CLK signal, a drain coupled to the NCLK_N node, and a source coupled to a second intermediate node;
   a second PFET having a drain coupled to the second intermediate node, a source coupled to a high voltage source in the high voltage domain, and a gate coupled to the CLKI signal;
   a third NFET having a drain coupled to the NCLK_N node, a source coupled to the first intermediate node, and a gate coupled to the CLKI signal;
   a first inverter having an input coupled to the NCLK_N node and an output coupled to the CLKI signal;
   a third PFET having a source coupled to the high voltage source in the high voltage domain, a gate coupled to the ENCLK_T node, and a drain coupled to the NCLK_N node;
   a second inverter in a low power domain having an input coupled to the CLK signal and an output coupled to a third intermediate node;
   a first nor gate having a first input coupled to the third intermediate node, a second input coupled to the ENCLK_T node, and an output coupled to a fourth intermediate node; and
   a second nor gate having a first input coupled to the fourth intermediate node; a second input coupled to a MRST_P input signal, and an output coupled to the ENCLK_T node.

2. The level-shifting circuit of claim 1, wherein the third NFET is configured as a half-latch to maintain the NCLK_N node at a discharged state.

3. The level-shifting circuit of claim 2, wherein the CLK signal includes a positive edge configured to discharge the NCLK_N node to activate the half-latch.

4. The level-shifting circuit of claim 3, wherein the NCLK_N node is coupled to the input of the first inverter and configured to generate the CLKI signal.

5. The level-shifting circuit of claim 4, wherein the CLK signal propagates through two gate delays to generate the CLKI signal.

6. The level-shifting circuit of claim 1 further comprising an array-tracking timing delay circuit configured to provide the MRST_P input signal to reset the level-shifting circuit.

7. The level-shifting circuit of claim 6, wherein the array-tracking timing delay circuit includes a plurality of inverters.

8. The level-shifting circuit of claim 6, wherein the CLK signal includes a first pulse-width and the CLKI signal includes a pulse-width that is independent of the first pulse-width from the CLK signal.

9. The level-shifting circuit of claim 8, wherein the MRST_P input signal determines the pulse-width of the CLKI signal.

10. A method of operating a memory clock level-shifter configured to generate a CLKI signal in a high voltage domain in response to a CLK signal in a low voltage domain comprising the steps:
    configuring a first NFET having a gate coupled to the CLK signal in a low voltage domain, a drain coupled to a NCLK_N node, and a source coupled to a first intermediate node;
    configuring a second NFET having a drain coupled to the first intermediate node, a source coupled to ground, and a gate coupled to an ENCLK_T node;
    configuring a first PFET having a gate coupled to the CLK signal, a drain coupled to the NCLK_N node, and a source coupled to a second intermediate node;
    configuring a second PFET having a drain coupled to the second intermediate node, a source coupled to a high voltage source in the high voltage domain, and a gate coupled to the CLKI signal;
    configuring a third NFET having a drain coupled to the NCLK_N node, a source coupled to the first intermediate node, and a gate coupled to the CLKI signal;
    configuring a first inverter having an input coupled to the NCLK_N node and an output coupled to the CLKI signal;
    configuring a third PFET having a source coupled to the high voltage source in the high voltage domain, a gate coupled to the ENCLK_T node, and a drain coupled to the NCLK_N node;
    configuring a second inverter having an input coupled to the CLK signal and an output coupled to a third intermediate node;
    configuring a first nor gate having a first input coupled to the third intermediate node, a second input coupled to the ENCLK_T node, and an output coupled to a fourth intermediate node; and
    configuring a second nor gate having a first input coupled to the fourth intermediate node; a second input coupled to a MRST_P input signal, and an output coupled to the ENCLK_T node.

11. The method of operating the memory clock level-shifter of claim 10 further comprising the step of maintaining the NCLK_N node at a discharged state with a half-latch.

12. The method of operating the memory clock level-shifter of claim 11 further comprising the step of activating the half-latch with a positive edge of the CLK signal to discharge the NCLK_N node.

13. The method of operating the memory clock level-shifter of claim 12 wherein the NCLK_N node is coupled to the input of the first inverter and further comprises the step of inverting the input at the first inverter to generate the CLKI signal.

14. The method of operating the memory clock level-shifter of claim 13 further comprising the step of propagating the CLK signal through two gate delays to generate the CLKI signal.

15. The method of operating the memory clock level-shifter of claim 10 further comprising an array-tracking timing delay circuit and the step further comprises resetting the memory clock level-shifter with the MRST_P input signal from an output of the array-tracking timing delay circuit.

16. The method of operating the memory clock level-shifter of claim 15, wherein the array-tracking timing delay circuit further comprises the step of mimicking a dummy array bit-cell to generate the MRST_P input signal.

17. The method of operating the memory clock level-shifter of claim 15, wherein the CLK signal includes a first pulse-width and the step further comprises generating the CLKI signal that is pulse-width independent with the first pulse-width of the CLK signal.

18. The method of operating the memory clock level-shifter of claim 17 further comprising the step of controlling a pulse-width of the CLKI signal with the MRST_P input signal.

\* \* \* \* \*

UNITED STATES PATENT AND TRADEMARK OFFICE
CERTIFICATE OF CORRECTION

PATENT NO. : 10,706,916 B1
APPLICATION NO. : 16/374666
DATED : July 7, 2020
INVENTOR(S) : Harold Pilo et al.

Page 1 of 1

It is certified that error appears in the above-identified patent and that said Letters Patent is hereby corrected as shown below:

On the Title Page

Under item (71) "Applicant" delete "Synopsis, Inc." and insert --Synopsys, Inc.--

Signed and Sealed this
Twenty-seventh Day of October, 2020

Andrei Iancu
*Director of the United States Patent and Trademark Office*